United States Patent
Pan et al.

(10) Patent No.: US 6,958,271 B1
(45) Date of Patent: Oct. 25, 2005

(54) METHOD OF FABRICATING A DUAL-LEVEL STACKED FLASH MEMORY CELL WITH A MOSFET STORAGE TRANSISTOR

(75) Inventors: James Pan, San Jose, CA (US); Ning Cheng, Cupertino, CA (US); Christy Mein Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 129 days.

(21) Appl. No.: 10/634,042

(22) Filed: Aug. 4, 2003

(51) Int. Cl.[7] .......................................... H01L 21/336
(52) U.S. Cl. ...................... 438/257; 438/258; 438/289
(58) Field of Search ............................. 438/257–258, 438/289–291, 265–267

(56) References Cited

U.S. PATENT DOCUMENTS

| | | | |
|---|---|---|---|
| 5,894,146 A * | 4/1999 | Pio et al. ..................... 257/319 |
| 5,923,975 A * | 7/1999 | Rolandi ....................... 438/258 |
| 6,329,254 B1 * | 12/2001 | Cremonesi et al. ......... 438/289 |
| 6,493,265 B2 | 12/2002 | Satoh et al. |
| 6,818,512 B1 * | 11/2004 | Hsieh .......................... 438/267 |
| 2002/0163031 A1 | 11/2002 | Liu et al. |
| 2003/0007384 A1 | 1/2003 | Shimizu |
| 2003/0039146 A1 | 2/2003 | Choi |

* cited by examiner

*Primary Examiner*—Dung A. Le
(74) *Attorney, Agent, or Firm*—Eschweiler & Associates, LLC

(57) ABSTRACT

The present invention relates to methods of fabricating dual-level flash memory cells. A first active region and a second active region are formed in a substrate. A trench is formed in the substrate between the first active region and the second active region. A first insulator dielectric is formed on the substrate and within the trench forming a vertical structure. A first poly layer is formed on the first insulator dielectric. A second insulator dielectric is formed on at least a portion of the first poly layer. A second poly layer is formed on the second insulator dielectric.

5 Claims, 12 Drawing Sheets

METHOD OF FABRICATING A DUAL-LEVEL STACKED FLASH MEMORY CELL WITH A MOSFET STORAGE TRANSISTOR

FIELD OF THE INVENTION

The present invention relates generally to memory devices, and more particularly, to multiple bit flash memory devices.

BACKGROUND OF THE INVENTION

Flash memory is a type of electronic memory media that can be rewritten and hold its content without power. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal along a given bit line coupled to a different word line, while all the flash cells in the array have their source terminals coupled to a common source terminal. In operation, individual flash cells are addressed via the respective bit line and word line using peripheral decoder and control circuitry for programming (writing), reading or erasing functions.

Such a single bit stacked gate flash memory cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped therein since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell (in one example), a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. However, these dual bit memory cells can require complex additional circuitry and/or be difficult to scale.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides a dual-level flash memory cell design that can yield 3 or more bits per transistor, that is scalable, and that can be operated with relatively simple peripheral circuitry. The memory cell employs multiple dielectric layers and poly layers so that more bits can be stored in the cell than with conventional configurations. Additionally, the multiple layers can facilitate scaling of the memory cell to higher densities than conventional configurations.

The dual-level memory cell stores two lower bits in a first level and stores an upper bit in a second level. The lower bits are programmed, erased and read by alternate modes of operation wherein active regions operate as source and drain, and then drain and source. The upper bit is programmed and erased independent of the lower bits. However, reading of the upper bit depends upon read values of the lower bits. Additional levels are employed to store more than 3 bits of information.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention provides a dual-level flash memory cell design that can yield 3 or more bits per transistor, that is scalable, and that can be operated with relatively simple peripheral circuitry. The memory cell employs multiple dielectric layers and poly layers so that more bits can be stored in the cell than with conventional configurations. Additionally, the multiple layers can facilitate scaling of the memory cell to smaller designs than conventional configurations.

The dual-level memory cell stores two lower bits in a first level and stores an upper bit in a second level. The lower bits are programmed, erased and read by alternate modes of operation wherein active regions operate as source and drain, and then drain and source. The upper bit is programmed and erased independent of the lower bits. However, reading of the upper bit depends upon read values of the lower bits.

Figure 1:
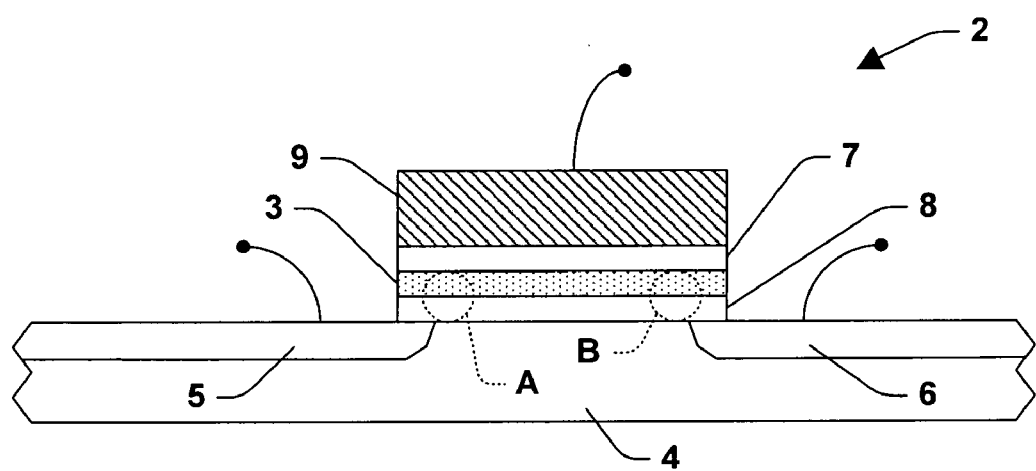
FIG. 1 is cross sectional view illustrating an exemplary dual bit memory cell.

Referring now to the drawings, FIG. 1 illustrates an exemplary dual bit memory cell 2. The memory cell 2 comprises a charge trapping layer 3 with buried polysilicon islands (not numerically designated) therein. The charge trapping layer 3 may comprise silicon nitride or any other type of charge trapping layer and is sandwiched between two layers of silicon dioxide 7 and 8. A P-type substrate 4 has buried N+ source 5 and N+ drain 6 regions.

Overlying the oxide layer 7 is a polysilicon gate 9. This gate 9 is doped, for example, with an N-type impurity (e.g., phosphorus). The memory cell 2 is capable of storing two data bits, a left bit represented by the dashed circle A and a right bit represented by the dashed circle B. The dual bit memory cell 2 is generally symmetrical, thus the drain 6 and the source 5 are interchangeable. Thus, the left junction 5 may serve as the source terminal and the right junction 6 as the drain terminal with respect to the right bit B. Likewise, the right junction 6 may serve as the source terminal and the left junction 5 as the drain terminal for the left bit A.

Although the dual bit cell advantageously allows for an increase in memory density over the traditional stacked gate cell, the planar dual bit cell has some limitations including scalability. As the cell is reduced in size, such reduction can be limited by the lateral trapping capability for the multiple bits A and B. As will be more fully appreciated below, the present invention advantageously improves memory density despite the scalability issue highlighted above.

Figure 2:
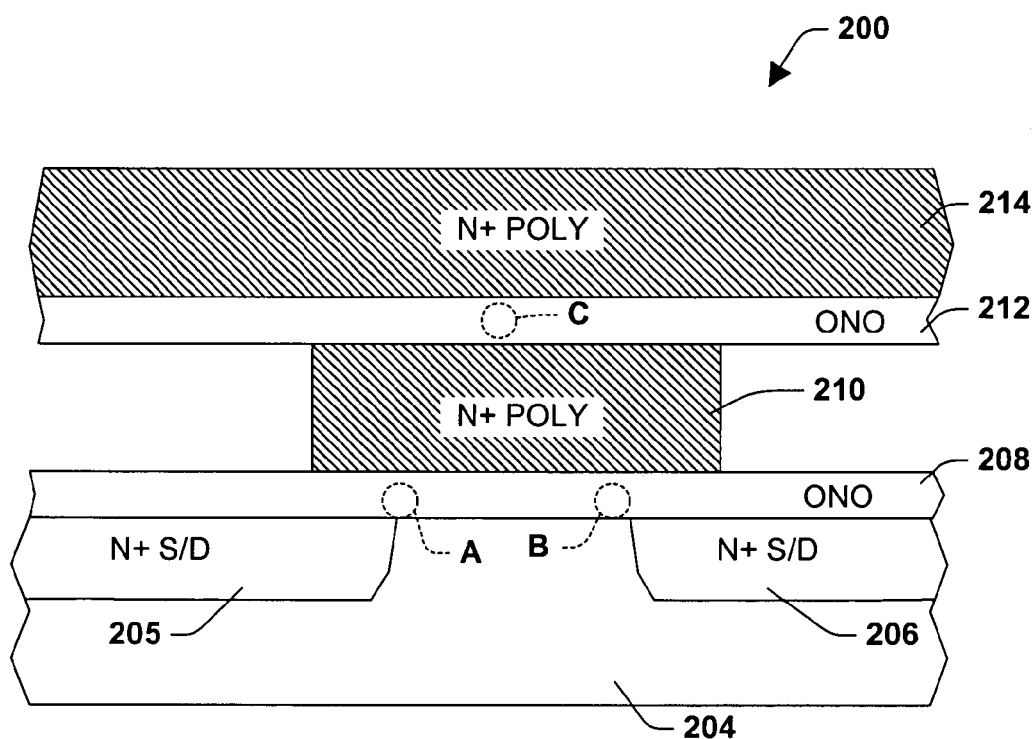
FIG. 2 is a cross sectional view illustrating a dual-level memory cell in accordance with an aspect of the present invention.

FIG. 2 is a cross sectional view of a dual-level memory cell 200 in accordance with an aspect of the present invention. The memory cell 200 is operable to store three bits (i.e., stored electrons) at locations A, B, and C as illustrated in FIG. 2. The memory cell 200 and variations thereof can be scalable according to sub 45 nm rules or even sub 25 nm rules.

A p-type substrate 204 is provided in which a first active region 205 and a second active region 206 are formed. The first active region 205 and the second active region 206 can each operate as a source or a drain and are formed by implanting an n-type dopant, such as phosphorous, into selected regions. A first insulator dielectric 208 is formed on at least a portion of the substrate 204 and the active regions 205 and 206. The insulator dielectric 208 is comprised of one or more layers and operates to trap charge. Generally, the insulator dielectric 208 comprises a narrow bandgap material (e.g., nitride, SiGe, and the like) placed between two silicon dioxide layers. For example, a suitable composition for the insulator dielectric 208 is oxide-nitride-oxide, also referred to as ONO, wherein a nitride layer is placed between first and second oxide layers. The first insulator dielectric 208 is operable to selectively store or trap electrons as indicated, approximately, at locations A and B so as to store two bits of information. These two bits stored in the first insulator dielectric 208 are also referred to as lower bits.

A first poly (polysilicon) layer 210 is formed on the first insulator dielectric 208. The first poly layer 210 operates as a first gate or a floating gate in some cell operations. A second insulator dielectric 212 is formed on the first poly layer 210. The second insulator dielectric 212 is also operable to selectively trap or store electrons as indicated, approximately, at location C. These stored electrons can represent a single bit of information, referred to as an upper bit. The second insulator dielectric 212 is also comprised of one or more layers and generally comprises a narrow bandgap material located between two silicon dioxide layers. For example, a suitable composition for the insulator dielectric 212 is oxide-nitride-oxide, also referred to as ONO. A second poly layer 214 is formed on the second insulator dielectric 212. The second poly layer 214 operates as a gate or second gate for some cell operations. The first poly layer 210 and the second poly layer 214 are typically comprised of polysilicon, but can be comprised of other suitable materials that provide a source of electrons such as metal. The first insulator dielectric 208 and the first poly layer 210 are collectively referred to as a first level. Similarly, the second insulator dielectric 212 and the second poly layer 214 are collectively referred to as a second level.

The lower bits can be programmed in a manner similar to that of other "mirror bit" configured memory cells. Thus, the first active region 205 is operable to serve as the source terminal and the second active region 206 is operable to serve as the drain terminal with respect to lower bit A. Similarly, the second active region 206 can serve as the source terminal and the first active region 205 can serve as the drain terminal for the lower bit B. Thus, the regions 205 and 206 can operate in either capacity or mode according to first (bit A) and second (bit B) modes of operation.

For each of the lower bits, the bit is programmed by applying a relatively high voltage to the first poly layer 210, connecting the "acting source" to ground, and connecting the "acting drain" to a predetermined potential above the "acting source". Due to a phenomena called "Fowler-Nordheim" tunneling, electrons pass through a portion of the first insulator dielectric 208 and become trapped. As a result of the trapped electrons, the threshold voltage is modified.

In order to erase the lower bits, a relatively high voltage is applied to the "acting source", and the first poly layer 210 is held at a negative potential, while the "acting drain" is allowed to float. Under these conditions, a strong electric field is developed across the first insulator dielectric 208 between the first poly layer 210 and the "acting source". The electrons that are trapped are extracted from the first insulator dielectric 208 and into the "acting source" region by way of Fowler-Nordheim tunneling through a portion of the first insulator dielectric 208. As the electrons are removed from the first insulator dielectric 208, the associated bit is erased.

The upper bit is programmed by connecting the second poly layer 214 to ground and applying a negative voltage (e.g., 5 volts) to the first poly layer 210. Electrons from the first poly layer 210 tunnel through a portion of the second insulator dielectric 212 and become trapped. The trapped electrons modify the threshold voltage of the memory cell 200. Alternately, the upper bit can be programmed by connecting the first poly layer 210, the first active region 204, and the second active region 206 to ground and applying a negative voltage (e.g., 5 volts) to the second poly layer 214 by configuring the second insulator dielectric 212 differently as described infra.

The upper bit is erased by applying a negative voltage to the second poly layer 214 and connecting the first poly layer 210 to ground. As a result, electrons trapped in the second insulator dielectric 212 are extracted to the first poly layer 210. In an alternate aspect of the invention, the upper bit is erased by applying a negative voltage to the first poly layer 210 and connecting the second poly layer 214 to ground.

The memory cell 200 is read by a two step process. First, the lower bits are read in a manner similar to other mirror bit memory cells. Second, the upper bit is read by taking into consideration the read lower bits. The lower bits are read by applying a read voltage to the first poly layer 210 and detecting current flow across the acting source (connected to ground or applied with a ground potential) and drain in both modes of operation, wherein current flow typically indicates a logical "1" and absence of indicates a logical "0". As a result, read values are obtained for both lower bits, A and B.

The upper bit is read by applying a read voltage to the second poly layer 214 and allowing the first poly layer 210 to float. Again, current across the acting source and drain is measured to determine if substantial current flow exists, indicating storage of a logical "1" for the upper bit. The read voltage can be one of four values depending on the read values of the lower bits. That is, based on the states of bits A and B, it is can be determined what the proper read voltage should be to properly ascertain whether bit C is a "1" or a "0". Thus, based on the four possible states of A and B, a specific read voltage is employed on the second poly layer 214 and a resultant current is detected across the first and second active regions 205 and 206. Alternately, a selected voltage can be applied to the second poly layer and a relatively sensitive current measurement can be obtained. A value of the upper bit can be determined from the current measurement and the read values of the lower bits.

Figure 3:
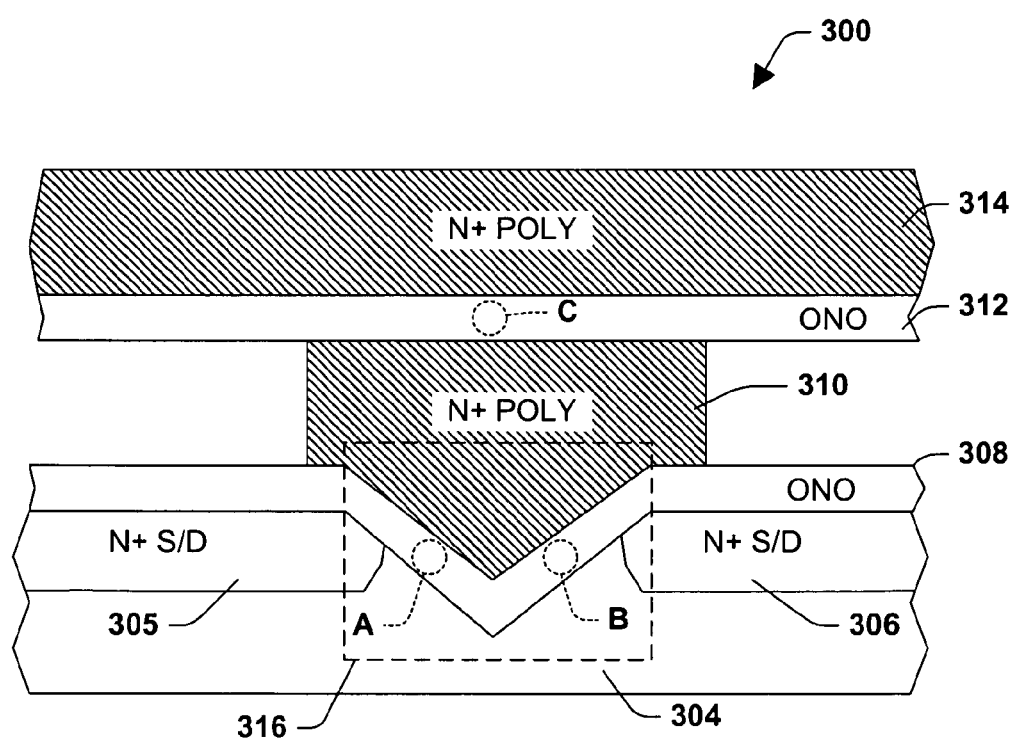
FIG. 3 is a cross sectional view illustrating a dual-level V-shaped memory cell in accordance with an aspect of the present invention.

FIG. 3 is a cross sectional view of a dual-level "V" memory cell 300 in accordance with an aspect of the present invention. The memory cell 300 is operable to store three bits (i.e., stored charge) at locations A, B, and C as illustrated in FIG. 3. Lower bits are stored separately in a vertical, V-shaped structure that facilitates scaling. The memory cell 300 and variations thereof can be scalable according to sub 45 nm rules or even sub 35 nm rules.

A p-type substrate 304 is provided in which a first active region 305 and a second active region 306 are formed. The first active region 305 and the second active region 306 can each operate as a source or a drain and are formed by implanting an n-type dopant, such as phosphorous, into selected regions. A first insulator dielectric 308 is formed on at least a portion of the substrate 304 and the active regions 305 and 306 so as to yield a vertical structure 316 that selectively isolates the lower bits. The insulator dielectric 308 is comprised of one or more layers and operates to trap charge. Generally, the insulator dielectric 308 comprises a narrow bandgap material (e.g., nitride, SiGe, and the like) placed between two silicon dioxide layers. The first insulator dielectric 308 is operable to selectively store or trap electrons as indicated, approximately, at locations A and B so as to store two bits of information. These two bits stored in the first insulator dielectric 308 are also referred to as lower bits. The V-shape of the vertical structure 316 isolates trapped electrons associated with the lower bits from each other.

A first poly (polysilicon) layer 310 is formed on the first insulator dielectric 308. The first poly layer 310 operates as a floating gate or first gate in some cell operations. A second insulator dielectric 312 is formed on the first poly layer 310. The second insulator dielectric 312 is also operable to selectively trap or store electrons as indicated, approximately, at location C. These stored electrons can represent a single bit of information, referred to as an upper bit. The second insulator dielectric 312 is also comprised of one or more layers and generally comprises a narrow bandgap material located between two silicon dioxide layers. A second poly layer or gate 314 is formed on the second insulator dielectric 312. The first poly layer 310 and the second poly layer 314 are typically comprised of polysilicon, but can be comprised of other suitable materials that provide a source of electrons such as metal.

The lower bits can be programmed in a manner similar to that of other "mirror bit" configured memory cells. Thus, the first active region 305 is operable to serve as the source terminal and the second active region 306 is operable to serve as the drain terminal with respect to lower bit A. Similarly, the second active region 306 can serve as the source terminal and the first active region 305 can serve as the drain terminal for the lower bit B. Thus, the regions 305 and 306 can operate in either capacity or mode according to first (bit A) and second (bit B) modes of operation.

For each of the lower bits, the bit is programmed by applying a relatively high voltage to the first poly layer 310, connecting the "acting source" to ground, and connecting the "acting drain" to a predetermined potential above the "acting source". Due to a phenomena called "Fowler-Nordheim" tunneling, electrons pass through a portion of the first insulator dielectric 308 and become trapped. As a result of the trapped electrons, the threshold voltage is modified.

In order to erase the lower bits, a relatively high voltage is applied to the "acting source", and the first poly layer 310 is held at a negative potential, while the "acting drain" is allowed to float. Under these conditions, a strong electric field is developed across the first insulator dielectric 308 between the first poly layer 310 and the "acting source". The electrons that are trapped are extracted from the first insulator dielectric 308 and into the "acting source" region by way of Fowler-Nordheim tunneling through a portion of the first insulator dielectric 308. As the electrons are removed from the first insulator dielectric 308, the associated bit is erased.

The upper bit is programmed by connecting the second poly layer 314 to ground and applying a negative voltage (e.g., 5 volts) to the first poly layer 310. Electrons from the first poly layer 310 tunnel through a portion of the second insulator dielectric 312 and become trapped. The trapped electrons modify the threshold voltage of the memory cell 300. Alternately, the upper bit can be programmed by connecting the first poly layer 310, the first active region 304, and the second active region 306 to ground and applying a negative voltage (e.g., 5 volts) to the second poly layer 314 by configuring the second insulator dielectric 312 differently as described infra.

The upper bit is erased by applying a negative voltage to the second poly layer 314 and connecting the first poly layer 310 to ground. As a result, electrons trapped in the second insulator dielectric 312 are extracted to the first poly layer 310. In an alternate aspect of the invention, the upper bit is erased by applying a negative voltage to the first poly layer 310 and connecting the second poly layer 314 to ground.

The memory cell 300 is read via a two step process. First, the lower bits are read in a manner similar to other mirror bit memory cells. Second, the upper bit is read by taking into consideration the read lower bits. The lower bits are read by applying a threshold voltage to the first poly layer 310 and detecting current flow in both modes of operation, wherein current flow typically indicates a logical "1" and absence of indicates a logical "0". As a result, read values are obtained for both lower bits, A and B.

The upper bit is read by applying a read voltage to the second poly layer 314 and allowing the first poly layer 310 to float. Again, current is measured to determine if substantial current flow exists, indicating storage of a logical "1" for the upper bit. The read voltage, as discussed supra can be one of four values depending on the read values of the lower bits. Alternately, a selected voltage can be applied to the second poly layer and a relatively sensitive current measurement can be obtained. A value of the upper bit can be determined from the current measurement and the read values of the lower bits.

Figure 4:
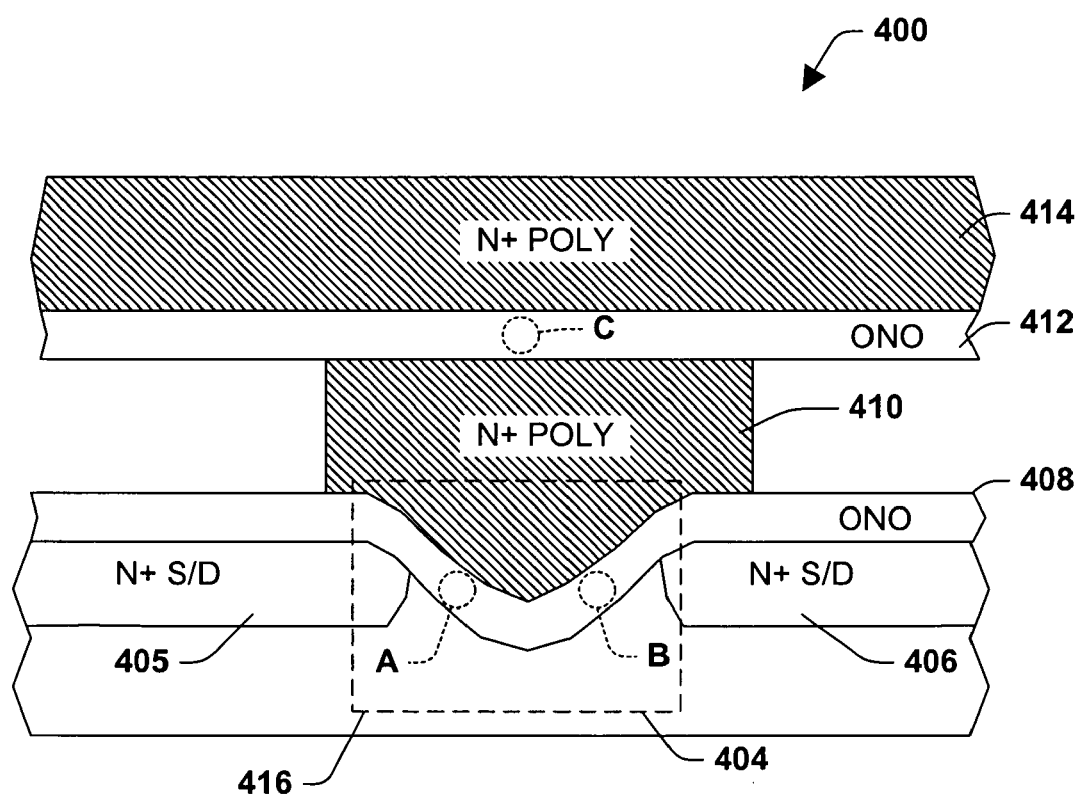
FIG. 4 is a cross sectional view illustrating a dual-level U-shaped memory cell in accordance with an aspect of the present invention.

FIG. 4 is a cross sectional view of a dual-level U shaped memory cell 400 in accordance with an aspect of the present invention. The memory cell 400 is operable to store three bits (i.e., stored electrons) at locations A, B, and C as illustrated in FIG. 4. Lower bits are stored separately in a vertical, U-shaped structure that facilitates scaling. The memory cell 400 and variations thereof can be scalable according to sub 45 nm rules or even sub 45 nm rules.

A p-type substrate 404 is provided in which a first active region 405 and a second active region 406 are formed. The first active region 405 and the second active region 406 can each operate as a source or a drain and are formed by implanting an n-type dopant, such as phosphor, into selected regions. A first insulator dielectric 408 is formed on at least a portion of the substrate 404 and the active regions 405 and 406 so as to yield a vertical structure 416 that selectively isolates the lower bits. The insulator dielectric 408 is comprised of one or more layers and operates to trap charge. Generally, the insulator dielectric 408 comprises a narrow bandgap material (e.g., nitride, SiGe, and the like) placed between two silicon dioxide layers. The first insulator dielectric 408 is operable to selectively store or trap electrons as indicated, approximately, at locations A and B so as to store two bits of information. These two bits stored in the first insulator dielectric 408 are also referred to as lower bits. The U-shape of the vertical structure 416 isolates trapped electrons associated with the lower bits from each other.

A first poly (polysilicon) layer 410 is formed on the first insulator dielectric 408. The first poly layer 410 operates as a floating gate or first gate in some aspects of cell operation. A second insulator dielectric 412 is formed on the first poly layer 410. The second insulator dielectric 412 is also operable to selectively trap or store electrons as indicated, approximately, at location C. These stored electrons can represent a single bit of information, referred to as an upper bit. The second insulator dielectric 412 is also comprised of one or more layers and generally comprises a narrow bandgap material located between two silicon dioxide layers. A second poly layer or gate 414 is formed on the second insulator dielectric 412. The first poly layer 410 and the second poly layer 414 are typically comprised of polysilicon, but can be comprised of other suitable materials that provide a source of electrons such as metal.

Programming and erasing of the lower bits and upper bit is performed as described with respect to FIGS. 2–3 and is omitted for brevity. The lower bits and the upper bit are also read via a two step process as described in FIGS. 2–3 wherein the lower bits are read first and at least partially employed to read the upper bit.

Figure 5:
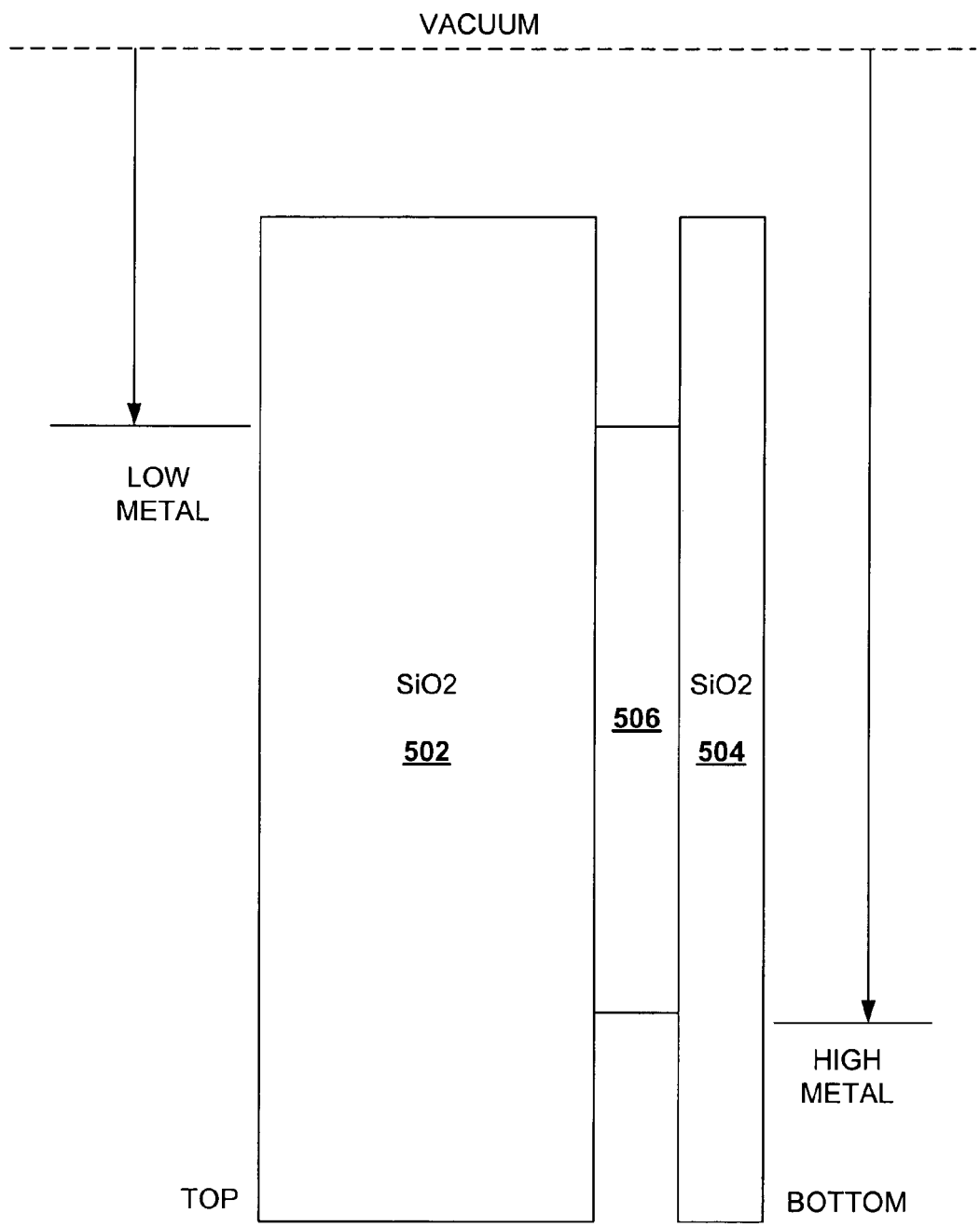
FIG. 5 is a cross sectional view illustrating an exemplary insulator dielectric in accordance with an aspect of the present invention.

Turning now to FIG. 5, an exemplary insulator dielectric 500 is illustrated in accordance with an aspect of the present invention. The insulator dielectric 500 facilitates charge trapping and, therefore, information storage for dual level memory cells of the present invention. Additionally, the insulator dielectric 500 facilitates programming, erasing, and reading of memory cells of the present invention. The insulator dielectric 500 can be employed in memory cells of the present invention such as described with respect to FIGS. 2, 3 and 4.

The insulator dielectric 500 is comprised of a top dielectric 502, a bottom dielectric 504, and a narrow bandgap material 506. As depicted, the narrow bandgap material 506 is located between the top dielectric 502 and the bottom dielectric 504. The top dielectric 502 is typically substantially thicker than the thinner bottom dielectric 504. The top dielectric 502 is substantially thick so as to substantially mitigate passage of electrons therethrough whereas the bottom dielectric 504 is relatively thin so as to permit tunneling of electrons. The narrow bandgap material 506 provides a storage mechanism for trapped charge. The top and bottom dielectrics 502 and 504 are comprised of a dielectric material such as silicon dioxide. The narrow bandgap material 506 is comprised of a suitable material such as Nitride, SiGe, and the like.

During program operations, electrons can be drawn by a negative electric field from an electron source (e.g., metal or polysilicon) (not shown) through the bottom dielectric 504 via tunneling and into the narrow bandgap material 506. The top dielectric 502 prevents the electrons from migrating in that direction. During erase operations, the opposite action occurs. Electrons are drawn out of the bandgap material 506 by a negative field in the opposite direction. The electrons again tunnel through the bottom dielectric 504, but migrate to the electron source (not shown) instead of from it.

It is appreciated that variations of the insulator dielectric 500 are contemplated and in accordance with the present invention. For example, the bottom dielectric 504 can be relatively thick compared with the top dielectric 502 such that electrons are able to tunnel through the top dielectric 502 instead of the bottom dielectric 504. In this option, for example, programming or erasing the top bit can be done with electrons traveling from and to the top poly layer (not shown), respectively.

Figure 6:
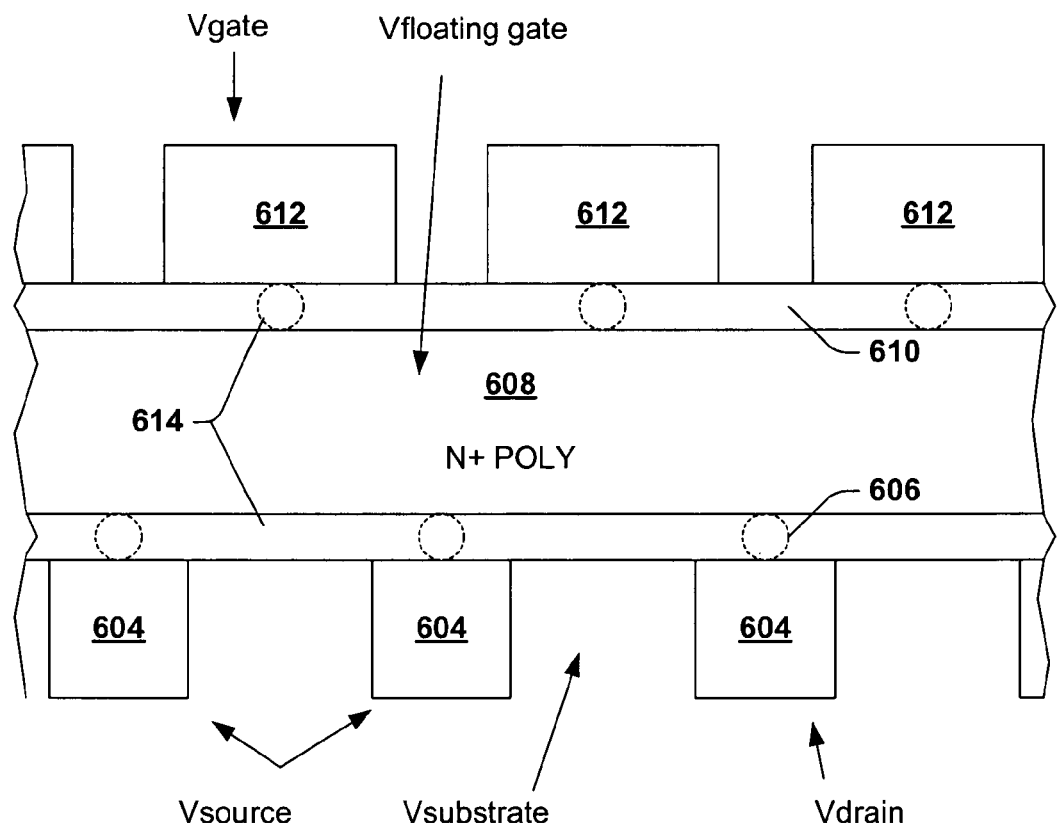
FIG. 6 is a cross sectional view illustrating a memory device in accordance with an aspect of the present invention.

FIG. 6 is a cross sectional view of a memory device 600 in accordance with the present invention. The memory device 600 includes a number of planar memory cells of the present invention. The device 600 includes active regions 604, a first insulator dielectric 606, first poly layers 608, a second insulator dielectric 610, and second poly layers 612. Stored/trapped electrons 614 are maintained in the first insulator dielectric 606 and the second insulator dielectric 610 as illustrated. FIG. 6 also illustrates exemplary locations for applying gate, floating gate, source, drain, and substrate voltages.

The active regions 604 serve as sources and drains for the respective memory cells. The first insulator dielectric 606 stores lower bits. The first poly layers 608 operate as a first gate(s) or floating gate(s) for some cell operations and also facilitate programming and erasing of the lower bits and upper bits. The second insulator dielectric 610 stores upper bits (one per cell). The second poly layers 612 operate as second gates for the cells and facilitate programming and erasing of the upper bits.

Figure 7:
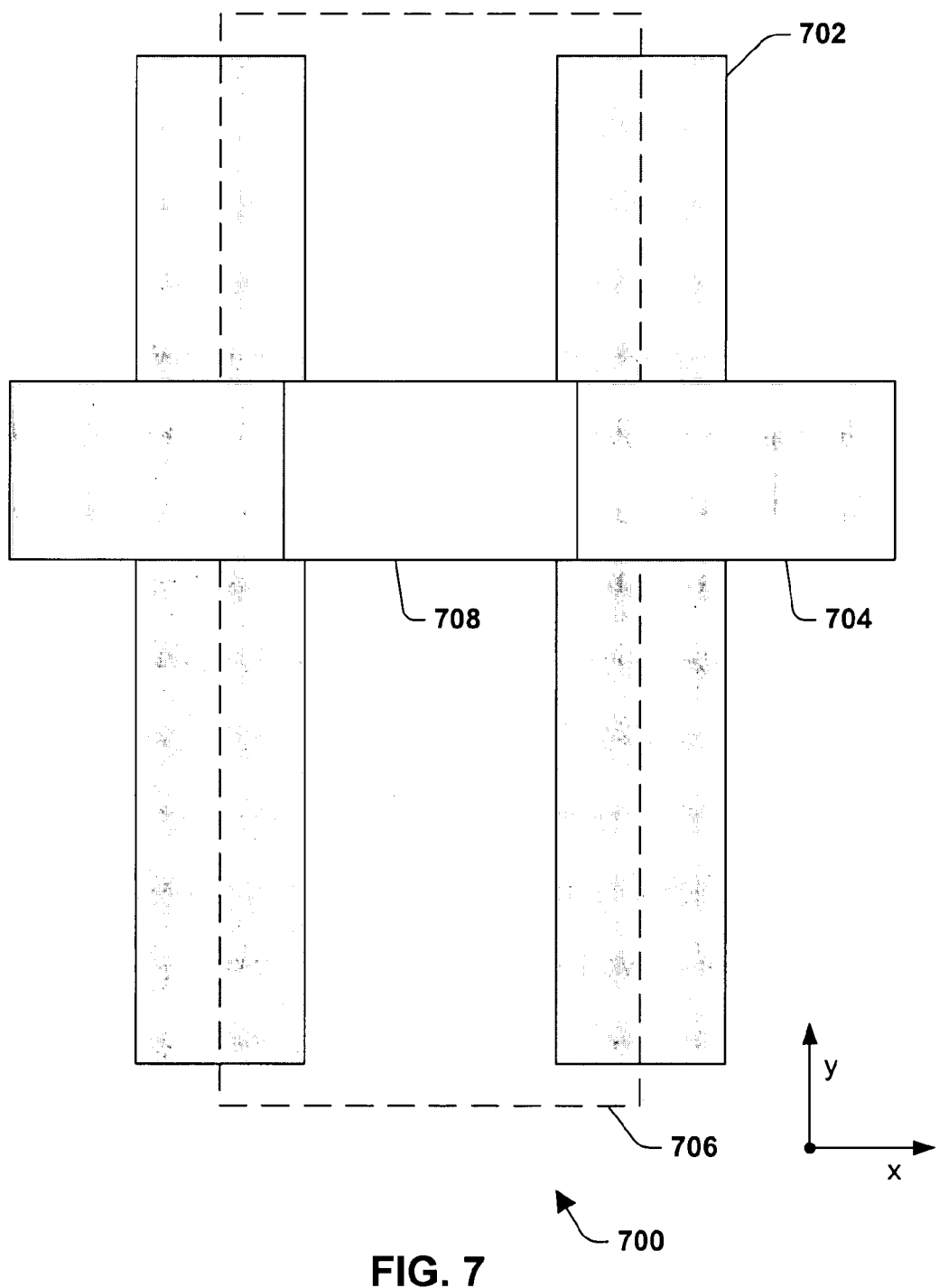
FIG. 7 is a top view illustrating an exemplary insulator dielectric in accordance with an aspect of the present invention.

Continuing on with FIG. 7, a top view illustrating a memory device 700 in accordance with an aspect of the present invention is presented. Only some portions of the device 700 are shown in order to facilitate and further illustrate an exemplary layout of the device. It is appreciated that other suitable configurations and layouts for dual or multiple level memory cells can be employed in accordance with the present invention.

Active regions 702 are depicting lying in the y-direction. Isolation areas are not present within the active regions 702 so the entire region is active silicon (e.g., doped with N+). A first poly layer 704, also referred to as a floating gate poly layer, is shown lying in the x-direction. The first poly layer 704 can operate as a word line for cell operations. A second poly layer 706, also referred to as a floating gate poly, is shown lying in the y-direction. The second poly layer 706 can also operate as a second bit line for some cell operations (programming). Additionally, region 706 connects adjacent bit lines with a contact 708 between adjacent poly layers 702 for operating the second poly layer 702 as the second bit line.

Figure 8:
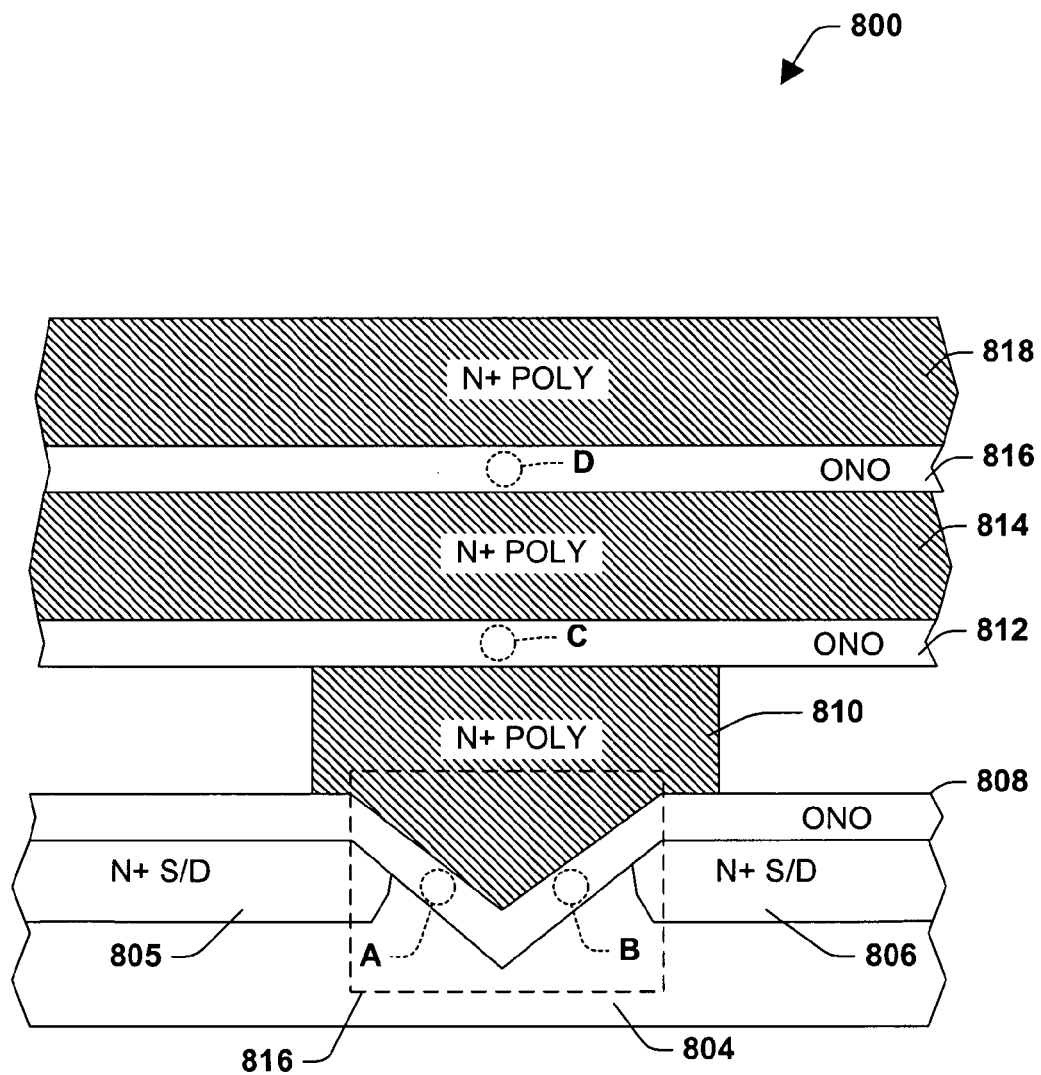
FIG. 8 is a cross sectional view illustrating a tri-level V-shaped memory cell in accordance with an aspect of the present invention.

FIG. 8 is a cross sectional view of a tri-level, V shaped memory cell 800 in accordance with an aspect of the present invention. The memory cell 800 is operable to store four bits (i.e., stored electrons) at locations A, B, C, and D as illustrated in FIG. 8. Lower bits are stored separately in a vertical, V-shaped structure that facilitates scaling. The memory cell 800 and variations thereof can be scalable according to sub 45 nm rules or even sub 85 nm rules.

A p-type substrate 804 is provided in which a first active region 805 and a second active region 806 are formed. The first active region 805 and the second active region 806 can each operate as a source or a drain and are formed by implanting an n-type dopant, such as phosphor, into selected regions. A first insulator dielectric 808 is formed on at least a portion of the substrate 804 and the active regions 805 and 806 so as to yield a vertical structure 816 that selectively isolates the lower bits. The insulator dielectric 808 is comprised of one or more layers and operates to trap charge. Generally, the insulator dielectric 808 comprises a narrow bandgap material (e.g., nitride, SiGe, and the like) placed between two silicon dioxide layers. The first insulator dielectric 808 is operable to selectively store or trap electrons as indicated, approximately, at locations A and B so as to store two bits of information. These two bits stored in the first insulator dielectric 808 are also referred to as lower bits. The V-shape of the vertical structure 816 isolates trapped electrons associated with the lower bits from each other.

A first poly (polysilicon) layer 810 is formed on the first insulator dielectric 808. The first poly layer 810 operates as a floating gate. A second insulator dielectric 812 is formed on the first poly layer 810. The second insulator dielectric 812 is also operable to selectively trap or store electrons as indicated, approximately, at location C. These stored electrons can represent a single bit of information, referred to as an upper bit. The second insulator dielectric 812 is also comprised of one or more layers and generally comprises a narrow bandgap material located between two silicon dioxide layers. A second poly layer or gate 814 is formed on the second insulator dielectric 812. A third insulator dielectric 816, also comprised of one or more layers, is formed on the second poly layer 814. The third insulator dielectric 816 is operable to selectively trap or store electrons as indicated at location D. This stored information can be referred to as a second upper bit. A third poly layer or gate 818 is formed on the third insulator dielectric 816. It is appreciated that additional insulator dielectrics and poly layers can be formed vertically on the third poly layer 818 so as to provide additional bit storage for the cell 800 (e.g., more than four bits of storage per cell).

The first poly layer 810, the second poly layer 814, and the third poly layer 818 are typically comprised of polysilicon, but can be comprised of other suitable materials that provide a source of electrons such as metal. The lower bits can be programmed in a manner similar to that of other "mirror bit" configured memory cells. Thus, the first active region 805 is operable to serve as the source terminal and the second active region 806 is operable to serve as the drain terminal with respect to lower bit B. Similarly, the second active region 806 can serve as the source terminal and the first active region 805 can serve as the drain terminal for the lower bit A. Thus, the regions 805 and 806 can operate in either capacity or mode according to first (bit A) and second (bit B) modes of operation.

For each of the lower bits, the bit is programmed by applying a relatively high voltage to the first poly layer 810, connecting the "acting source" to ground, and connecting the "acting drain" to a predetermined potential above the "acting source". Due to a phenomena called "Fowler-Nordheim" tunneling, electrons pass through a portion of the first insulator dielectric 808 and become trapped. As a result of the trapped electrons, the threshold voltage is modified.

In order to erase the lower bits, a relatively high voltage is applied to the "acting source", and the first poly layer 810 is held at a negative potential, while the "acting drain" is allowed to float. Under these conditions, a strong electric field is developed across the first insulator dielectric 808 between the first poly layer 810 and the "acting source". The electrons that are trapped are extracted from the first insulator dielectric 808 and into the "acting source" region by way of Fowler-Nordheim tunneling through a portion of the first insulator dielectric 808. As the electrons are removed from the first insulator dielectric 808, the associated bit is erased.

The upper bit is programmed by connecting the second poly layer 814 to ground and applying a negative voltage (e.g., 5 volts) to the first poly layer 810. Electrons from the first poly layer 810 tunnel through a portion of the second insulator dielectric 812 and become trapped. The trapped electrons modify the threshold voltage of the memory cell 800. Alternately, the upper bit can be programmed by connecting the first poly layer 810, the first active region 804, and the second active region 806 to ground and applying a negative voltage (e.g., 5 volts) to the second poly layer 814 by configuring the second insulator dielectric 812 differently as described infra.

The upper bit is erased by applying a negative voltage to the second poly layer 814 and connecting the first poly layer 810 to ground. As a result, electrons trapped in the second insulator dielectric 812 are extracted to the first poly layer 810. In an alternate aspect of the invention, the upper bit is erased by applying a negative voltage to the first poly layer 810 and connecting the second poly layer 814 to ground.

The second upper bit is programmed by connecting the third poly layer 818 to ground and applying a negative voltage (e.g., 5 volts) to the second poly layer 814. Electrons from the second poly layer 814 tunnel through a portion of the third insulator dielectric 816 and become trapped. The trapped electrons modify the threshold voltage of the memory cell 800. Alternately, the second upper bit can be programmed by connecting the second poly layer 814, the first poly layer 810, the first active region 804, and the second active region 806 to ground and applying a negative voltage (e.g., 5 volts) to the third poly layer 818 by configuring the second insulator dielectric 812 differently as described supra.

The second upper bit is erased by applying a negative voltage to the third poly layer 818 and connecting the second poly layer 814 to ground. As a result, electrons trapped in the second insulator dielectric 812 are extracted to the second poly layer 814. In an alternate aspect of the invention, the upper bit is erased by applying a negative voltage to the second poly layer 814 and connecting the third poly layer 818 to ground.

The memory cell 800 is read via a three step process. First, the lower bits are read in a manner similar to other mirror bit memory cells. Second, the upper bit is read by taking into consideration the read lower bits. Third, the second upper bit is read by taking into consideration the read upper bit and read lower bits. The lower bits are read by applying a threshold voltage to the first poly layer 810 and detecting current flow in both modes of operation, wherein current flow typically indicates a logical "1" and absence of indicates a logical "0". As a result, read values are obtained for both lower bits, A and B.

The upper bit is read by applying a read voltage to the second poly layer 814 and allowing the first poly layer 810 to float. Again, current is measured to determine if substantial current flow exists, indicating storage of a logical "1" for the upper bit. The read voltage can be one of four values depending on the read values of the lower bits. Alternately, a selected voltage can be applied to the second poly layer and a relatively sensitive current measurement can be obtained. A value of the upper bit can be determined from the current measurement and the read values of the lower bits. The second upper bit is read by applying a read voltage to the third poly layer 818 and allowing the first poly layer 810 and the second poly layer 814 to float. Again, current is measured to determine if substantial current flow exists, indicating storage of a logical "1" for the upper bit. The read voltage can be one of eight values depending on the read values of the lower bits. Alternately, a selected voltage can be applied to the third poly layer 818 and a relatively sensitive current measurement can be obtained. A value of the second upper bit can then be determined from the current measurement and the read values of the lower bits.

In view of the foregoing structural and functional features described supra, methodologies in accordance with various aspects of the present invention will be better appreciated with reference to FIGS. 9–12. While, for purposes of simplicity of explanation, the methodologies of FIGS. 9–12 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 9:
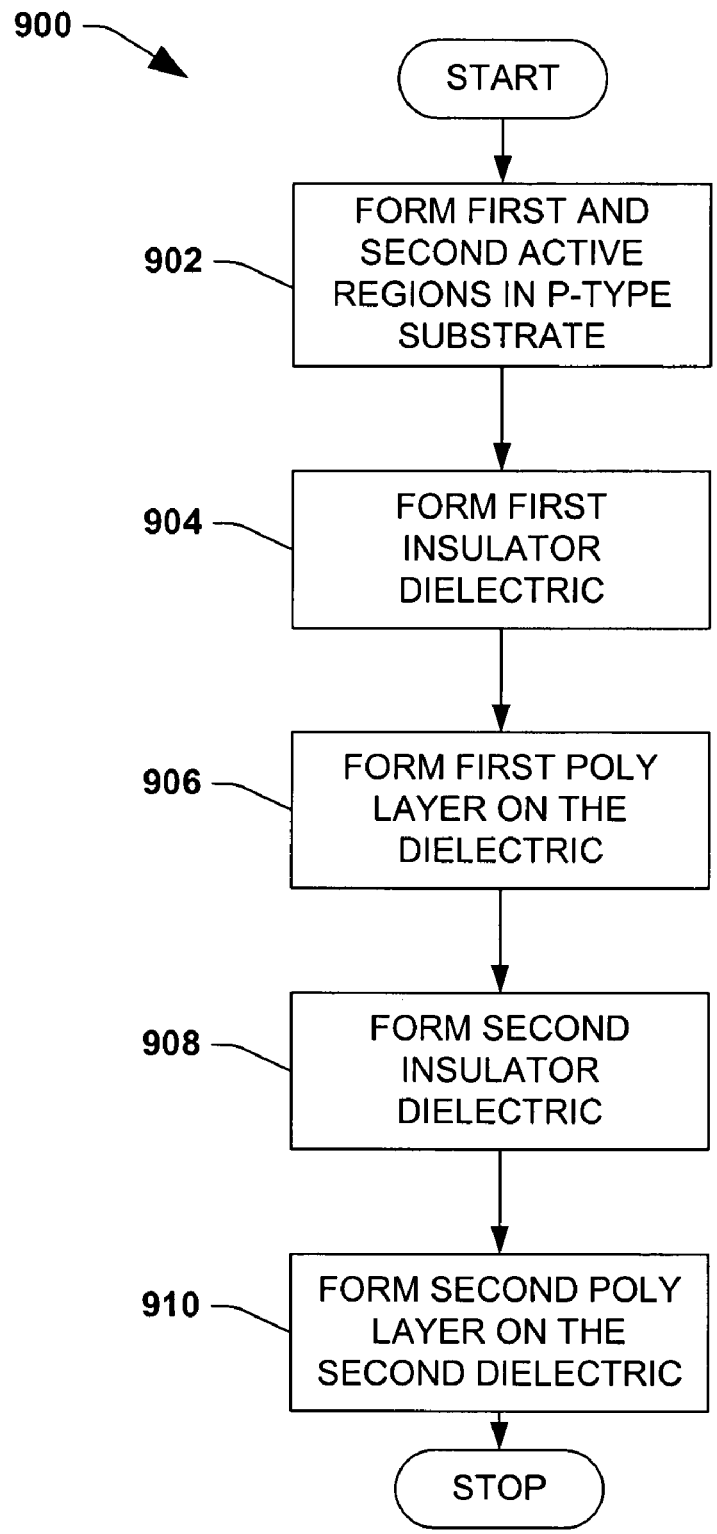
FIG. 9 is a flow diagram illustrating a method of fabricating a dual level memory cell in accordance with an aspect of the present invention.

Turning now to FIG. 9, a flow diagram illustrating a method 900 of fabricating a dual level memory cell in accordance with an aspect of the present invention is presented. The fabricated memory cell is operable to store three bits (i.e., stored electrons) at locations A, B, and C as illustrated in FIG. 2. The memory cell and variations thereof can be scalable according to sub 45 nm rules or even sub 25 nm rules.

Beginning at block 902, a first active region and a second active region are formed in a p-type substrate. The first active region and the second active region can each operate as a source or a drain and are formed by implanting an n-type dopant, such as phosphor, into selected regions. A first insulator dielectric is formed at block 904 on at least a portion of the substrate and the active regions and. In alternate aspects of the invention, a V or U shaped trench is formed between the active regions so as to facilitate scaling. The insulator dielectric is comprised of one or more layers and operates to trap charge. Generally, the insulator dielectric is comprised of a narrow bandgap material (e.g., nitride, SiGe, and the like) placed between two silicon dioxide layers. For example, a suitable composition for the insulator dielectric is oxide-nitride-oxide, also referred to as ONO, wherein a nitride layer is placed/formed between first and second oxide layers. The first insulator dielectric is operable to selectively store or trap electrons so as to store two bits of information. These two bits stored in the first insulator dielectric are also referred to as lower bits.

Continuing at block 906, a first poly (polysilicon) layer is formed on the first insulator dielectric. Alternately, a metal layer can be formed in place of the poly layer. A second insulator dielectric is formed on the first poly layer at block 908. The second insulator dielectric is also operable to selectively trap or store electrons. These stored electrons represent a single bit of information, referred to as an upper bit. The second insulator dielectric is also comprised of one or more layers and generally comprises a narrow bandgap material located between two silicon dioxide layers. At block 910, a second poly layer is formed on the second insulator dielectric. The first poly layer and the second poly layer are typically comprised of polysilicon, but can be comprised of other suitable materials that provide a source of electrons such as metal.

In alternate aspects of the invention, additional pairs of insulator dielectrics and poly layers can be formed on the second poly layer and can provide a capability of storing additional bits of information. Additional operations can be required for programming, erasing, and reading such memory cells.

Figure 10:
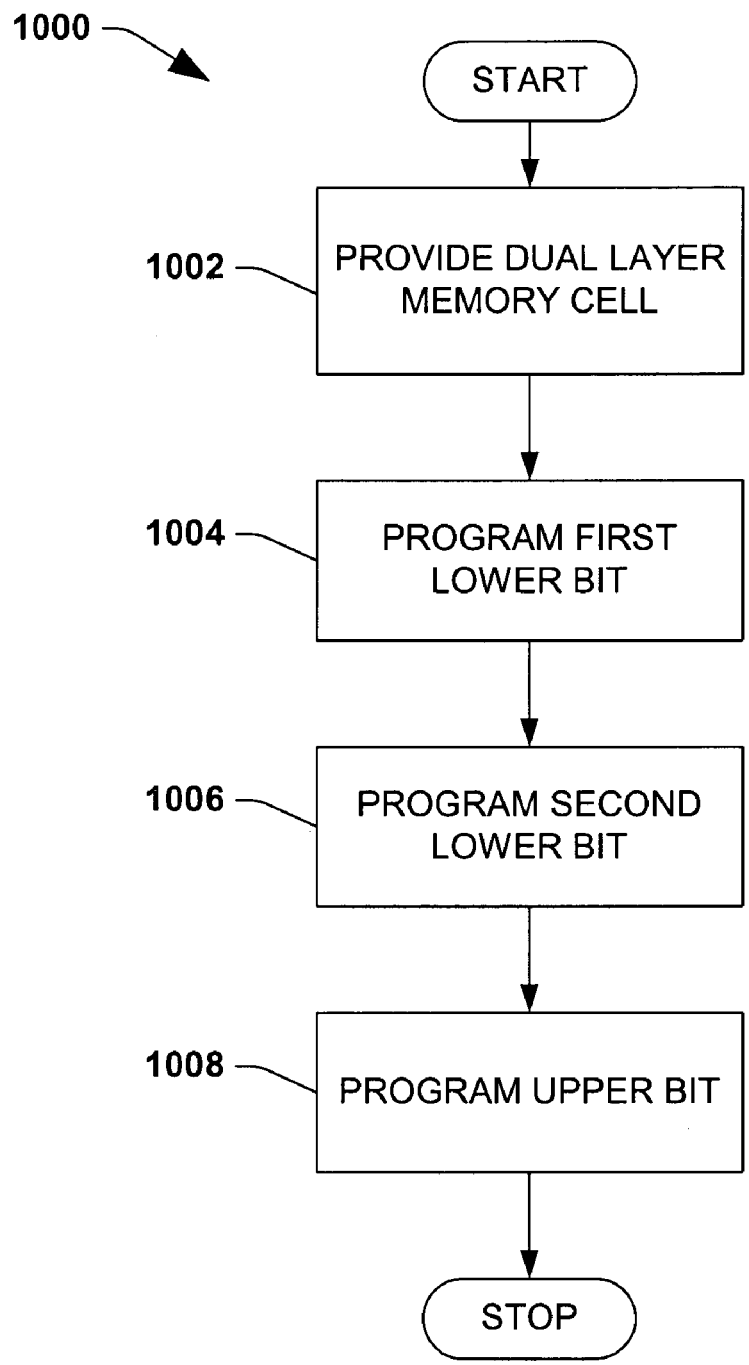
FIG. 10 is a flow diagram illustrating a method of programming a dual level memory cell in accordance with an aspect of the present invention.

FIG. 10 is a flow diagram illustrating a method 1000 of programming a dual level memory cell in accordance with an aspect of the present invention. The method 1000 is operable for the memory cells described supra, including variations thereof.

The method 1000 begins at block 1002 wherein a dual layer memory cell comprising a first active region, a second active region, a first insulator dielectric, a first gate, a second insulator dielectric, and a second gate is provided. The dual layer memory cell can be fabricated via the method 900 of FIG. 9 and/or variations thereof. A first lower bit is programmed in a first mode of operation at block 1004. The first lower bit is programmed by having the first active region operate as a source and the second active region operate as a drain. Then, a program voltage is applied to the first gate (e.g., first poly layer) of the memory cell. A second lower bit is programmed in a second mode of operation at block 1006. The second lower bit is programmed by having the first active region operate as a drain and the second active region operate as a source. The program voltage is again applied to the gate of the memory cell.

An upper bit of the memory cell is programmed at block 1008 by connecting the second gate (e.g., second poly layer) to ground and applying a negative voltage (e.g., 5 volts) to the first gate. Electrons from the first gate tunnel through a portion of a second insulator dielectric and become trapped. The trapped electrons modify the threshold voltage of the memory cell.

Figure 11:
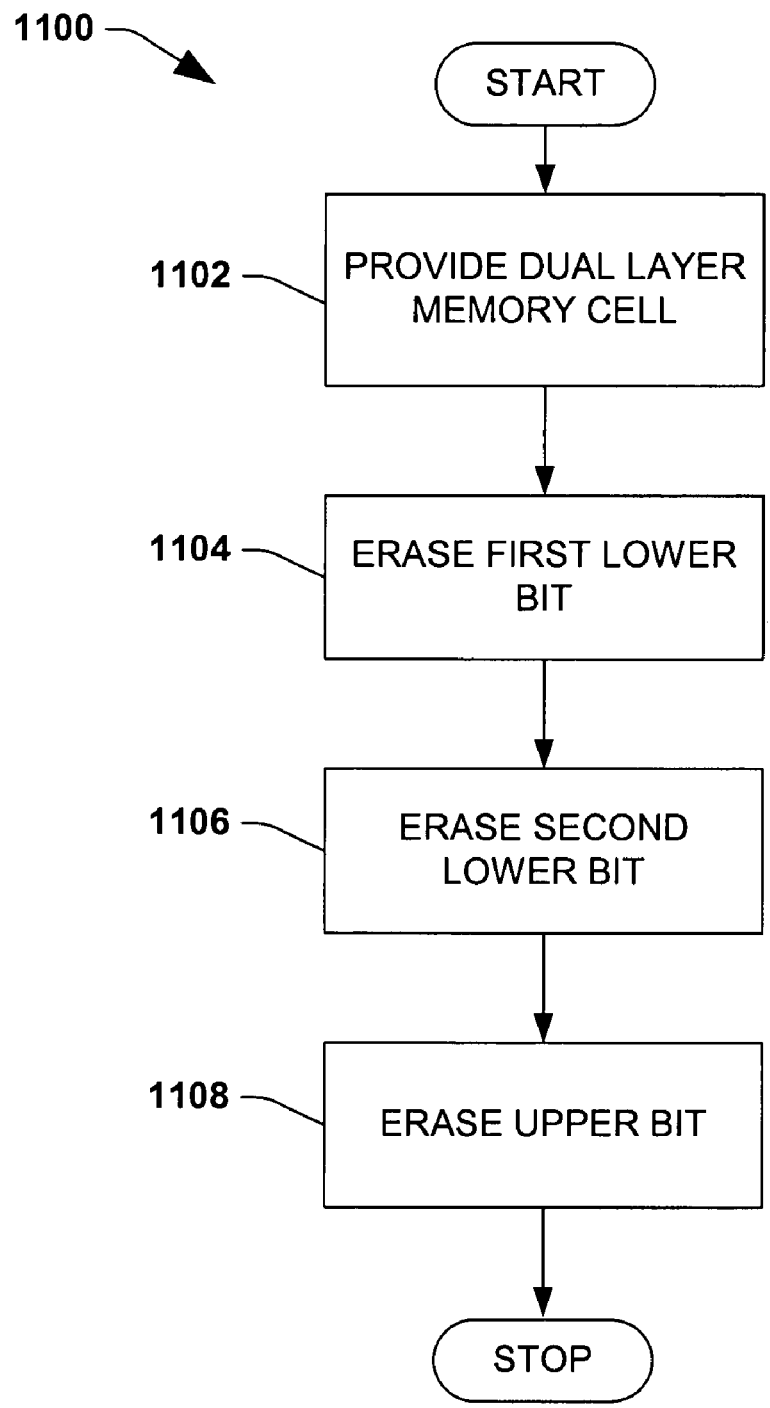
FIG. 11 is a flow diagram illustrating a method of erasing a dual level memory cell in accordance with an aspect of the present invention.

FIG. 11 is a flow diagram illustrating a method 1100 of erasing a dual level memory cell in accordance with an aspect of the present invention. The method 1100 is operable for the memory cells described supra, including variations thereof.

The method 1100 begins at block 1102 wherein a dual layer memory cell comprising a first active region, a second active region, a first insulator dielectric, a first gate, a second insulator dielectric, and a second gate is provided. The dual layer memory cell can be fabricated via the method 900 of FIG. 9 and/or variations thereof.

A first lower bit is erased at block 1104 in a first mode of operation by applying a relatively high voltage to the "acting source" and applying a negative voltage to the first gate while the "acting drain" is permitted to float. The "acting source" is the first active region and the "acting drain" is the second active region. Under these conditions, a strong electric field is developed across a region of the first insulator dielectric between the first poly layer and the "acting source". Trapped electrons are released from the first insulator dielectric to the "acting source" by way of Fowler-Nordheim tunneling through a portion of the first insulator dielectric. As the electrons are removed from the first insulator dielectric, the first lower bit is erased. Similarly, a second lower bit is erased at block 1106 in a second mode of operation by applying a relatively high voltage to the "acting source" and applying a negative voltage to the first gate while the "acting drain" is permitted to float. However, at block 1106, the "acting source" is the second active region and the "acting drain" is the first active region.

An upper bit is erased at block 1108 by applying a negative voltage to the second gate and connecting the first gate to ground. As a result, electrons trapped in the second insulator dielectric are released to the first poly layer. In an alternate aspect of the invention, the upper bit is erased by applying a negative voltage to the first poly layer and connecting the second poly layer to ground.

Figure 12:
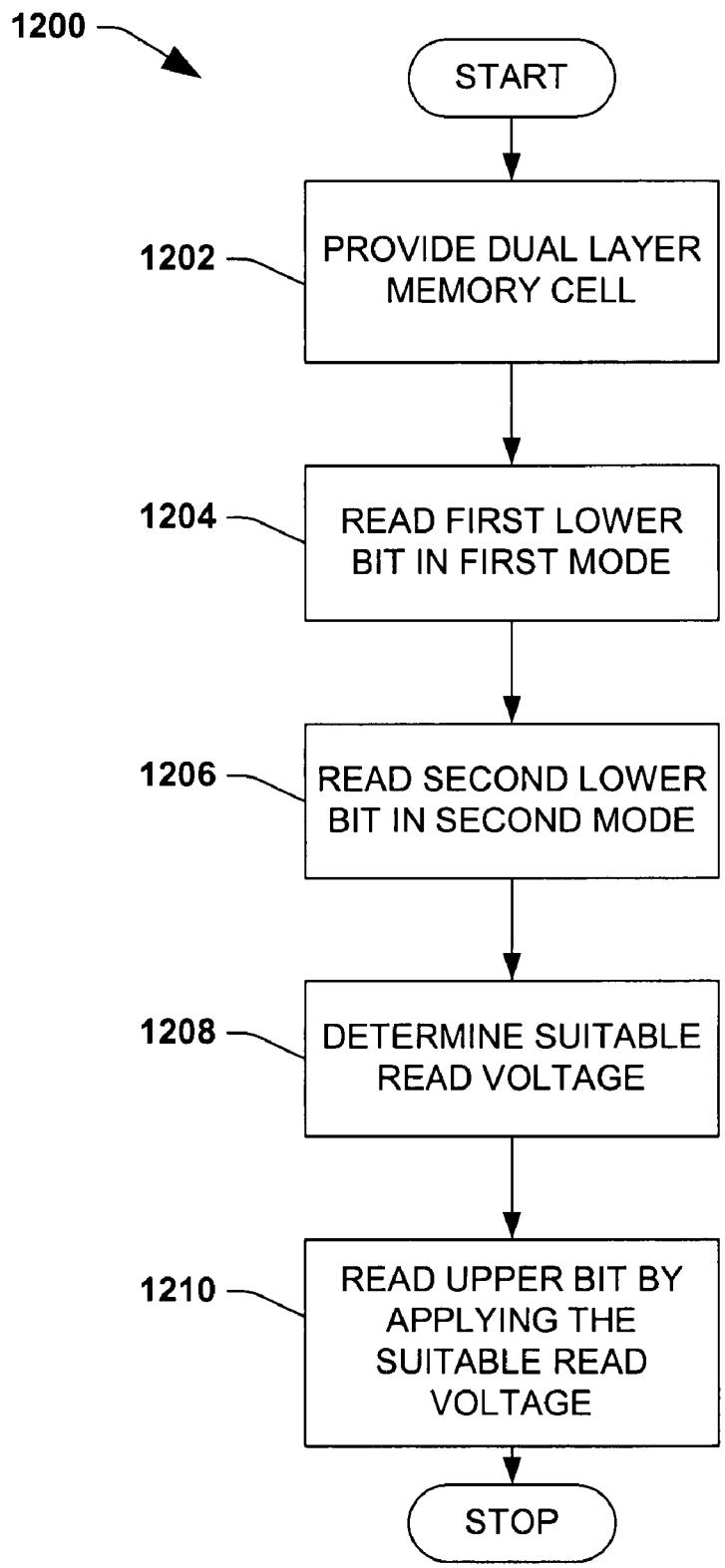
FIG. 12 is a flow diagram illustrating a method of reading a dual level memory cell in accordance with an aspect of the present invention.

FIG. 12 is a flow diagram illustrating a method 1200 of reading a dual layer memory cell in accordance with an aspect of the present invention. The method 1200 is operable for the memory cells described supra, including variations thereof. The method 1200 read the memory cell by a two step procedure. First, lower bits are read, and second, an upper bit is read by taking into consideration the read lower bits.

The method 1200 begins at block 1202 wherein a dual layer memory cell comprising a first active region, a second active region, a first insulator dielectric, a first gate, a second insulator dielectric, and a second gate is provided. The dual layer memory cell can be fabricated via the method 900 of FIG. 9 and/or variations thereof and as depicted in FIGS. 2–5 and/or variations thereof.

A first lower bit is read at block 1204 by applying a threshold voltage and detecting current flow in a first mode of operation, wherein the first active region operates as a source and the second active region operates as a drain. Generally, presence of current flow typically indicates a logical "1" and absence thereof of indicates a logical "0". Then, a second lower bit is read at block 1206 by applying a threshold voltage and detecting current flow in a second mode of operation, wherein the first active region operates as a drain and the second active region operates as a source. As a result, read values are obtained for the first and second lower bits.

A suitable read voltage is determined at block 1208 according to the read first and second lower bits. Typically, three or four possible threshold voltages are possible and they correspond to the read first and second lower bits. For example, a first possible threshold voltage could correspond to read logical values of "0" for both lower bits. The upper bit is read at block 1210 by applying the read voltage to the second gate and allowing the first gate to float. Again, current is measured to determine if substantial current flow exists, indicating storage of a logical "1" for the upper bit. Alternately, a selected voltage can be applied to the second poly layer and a relatively sensitive current measurement can be obtained. A value of the upper bit can be determined from the current measurement and the read values of the lower bits.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a dual level memory cell comprising:
    forming a first active region and a second active region in a substrate;
    forming a trench in the substrate between the first active region and the second active region;
    forming a first insulator dielectric on the substrate that forms a vertical structure within the trench;
    forming a first poly layer on the first insulator;
    forming a second insulator dielectric on at least a portion of the first poly layer; and
    forming a second poly layer on the second insulator dielectric.

2. A method of fabricating a dual level memory cell comprising:
    forming a first active region and a second active region in a substrate;
    forming a first insulator dielectric on the substrate;
    forming a first poly layer on the first insulator dielectric;
    forming a second insulator dielectric on at least a portion of the first poly layer; and
    forming a second poly layer on the second insulator dielectric;
    forming a trench in the substrate between the first active region and the second active region prior to forming the first insulator dielectric such that a vertical structure is formed by the first insulator dielectric; and
    wherein the vertical structure is V-shaped.

3. The method of claim 1, wherein forming the first insulator dielectric comprises forming a first oxide layer on the substrate, forming nitride on the first oxide layer, and forming a second oxide layer on the nitride.

4. The method of claim 1, wherein the first active region and the second active region are formed to be n-type and the substrate is p-type.

5. The method of claim 1, wherein the vertical structure is U-shaped.

* * * * *